Nov. 24, 1970 HIROMU OUCHI ET AL 3,542,683

PIEZOELECTRIC CERAMIC COMPOSITIONS

Filed Sept. 4, 1968

HIROMU OUCHI & MASAMITSU NISHIDA,
Inventors
By, Wenderoth, Lind & Ponack,
Attorneys United States Patent Office 3,542,683
Patented Nov. 24, 1970

3,542,683
PIEZOELECTRIC CERAMIC COMPOSITIONS

Hiromu Ouchi and Masamitsu Nishida, Osaka, Japan, assignors to Matsushita Electric Industrial Co., Ltd., Kadoma, Osaka, Japan Filed Sept. 4, 1968, Ser. No. 757,339
Claims priority, application Japan, Nov. 4, 1967, 42/71,261
Int. Cl. C04b *35/00;* H01v *7/02*
U.S. Cl. 252—62.9 5 Claims

ABSTRACT OF THE DISCLOSURE

Ceramic compositions of the formulae:

$Pb(Co_{1/3}Ta_{2/3})_{0.030}Ti_{0.625}Zr_{0.345}O_3$
$Pb(Co_{1/3}Ta_{2/3})_{0.250}Ti_{0.625}Zr_{0.125}O_3$
$Pb(Co_{1/3}Ta_{2/3})_{0.500}Ti_{0.375}Zr_{0.125}O_3$
$Pb(Co_{1/3}Ta_{2/3})_{0.500}Ti_{0.125}Zr_{0.375}O_3$
$Pb(Co_{1/3}Ta_{2/3})_{0.250}Ti_{0.125}Zr_{0.625}O_3$
$Pb(Co_{1/3}Ta_{2/3})_{0.030}Ti_{0.345}Zr_{0.625}O_3$ are particularly useful in the manufacture of transducer elements.

This invention relates to piezoelectric ceramic compositions and articles of manufacture fabricated therefrom. More particularly, the invention pertains to novel ferroelectric ceramics which are polycrystalline aggregates of certain constituents. These piezoelectric compositions are sintered to ceramics by per se conventional ceramic techniques and thereafter the sintered ceramics are polarized by applying a D-C (direct current) voltage between the electrodes to impart thereto electromechanical transducing properties similar to the well known piezoelectric effect. The invention also encompasses the calcined product of raw ingredients and articles of manufacture such as electromechanical transducers fabricated from the sintered ceramic.

The ceramic bodies materialized by the present invention exist basically in solid solution comprising the ternary system $Pb(Co_{1/3}Ta_{2/3})O_3$-$PbTiO_3$-$PbZrO_3$.

The use of piezoelectric materials in various transducer applications in the production, measurement and sensing of sound, shock, vibration, pressure, etc. has increased greatly in recent years. Both crystal and ceramic types of transducers have been widely used. But, because of their potentially lower cost and facility in the fabrication of ceramics with various shapes and sizes and their greater durability for high temperature and/or for humidity than that of crystalline substances such as Rochelle salt, piezoelectric ceramic materials have recently achieved importance in various transducer applications.

The piezoelectric characteristics required of ceramics vary with different applications. For example, electromechanical transducers such as phonograph pick-ups and microphones require piezoelectric ceramics characterized by a substantially high electromechanical coupling coefficient and dielectric constant. On the other hand, in filter applications of piezoelectric ceramics, it is desired that the material exhibits a higher value of mechanical quality factor and high electromechanical coupling coefficient. Furthermore, ceramic materials require a high stability with temperature and time in resonant frequency and in other electrical properties.

As more promising ceramic for these requirements, lead titanate-lead zirconate is in wide use up to now. However, it is difficult to get a very high mechanical quality factor along with high planar coupling coefficient in the lead titanate-lead zirconate ceramics. And the dielectric and piezoelectric properties of the lead titanate-lead zirconate ceramics change greatly with firing technique, which is ascribable to evaporation of PbO.

It is, therefore, the fundamental object of the present invention to provide novel and improved piezoelectric ceramic materials which overcome at least one of the problems outlined above. A more specific object of the invention is to provide improved polycrystalline ceramics characterized by very high mechanical quality factor along with high piezoelectric coupling coefficient.

Another object of the invention is the provision of novel piezoelectric ceramic compositions, certain properties of which can be adjusted to suit various applications.

A further object of the invention is the provision of improved electromechanical transducers utilizing, as the active elements, an electrostatically polarized body of the novel ceramic compositions.

These objects of the invention and the manner of their attainment will be readily apparent from a reading of the following description and from the accompanying drawing, in which.

Figure 1:
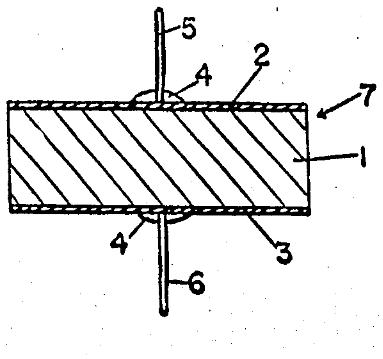
FIG. 1 is a cross-sectional view of an electromechanical transducer embodying the present invention.

Before proceeding with a detailed description of the piezoelectric materials contemplated by the invention, their application in electromechanical transducers will be described with reference to FIG. 1 of the drawings wherein reference character 7 designates, as a whole, an electromechanical transducer having, as its active element, a preferably disc-shaped body 1 of piezoelectric ceramic material according to the present invention.

Body 1 is electrostatically polarized, in a manner hereinafter set forth, and is provided with a pair of electrodes 2 and 3, applied in a suitable and per se conventional manner, on two opposed surfaces thereof. Wire leads 5 and 6 are attached conductively to the electrodes 2 and 3 respectively by means of solder 4. When the ceramic is subjected to shock, vibration or other mechanical stress, the generated electrical output can be taken from wire leads 5 and 6. Conversely, as with other piezoelectric transducers, application of electrical voltage to electrodes 2 and 3 will result in mechanical deformation of the ceramic body. It is to be understood that the term "electromechanical transducer" as used herein is taken in its broadest sense and includes piezoelectric filters, frequency control devices, and the like, and that the invention may also be used and adapted to various other applications requiring materials having dielectric, piezoelectric and/or electrostrictive properties.

According to the present invention, the ceramic body 1, FIG. 1, is formed of novel piezoelectric compositions which are polycrystalline ceramics composed of $Pb(Co_{1/3}Ta_{2/3})O_3$-$PbTiO_3$-$PbZrO_3$.

The present invention is based on the discovery that within particular ranges of this ternary system the specimens exhibit a very high mechanical quality factor along with high planar coupling coefficient.

The present invention has various advantages in manufacturing process and in application for ceramic transducers. It has been known that the evaporation of PbO during firing is a problem in sintering of lead compounds such as lead titanate zirconate. The invented composition, however, shows a smaller amount of evaporated PbO than usual lead titanate zirconate does. The ternary system can be fired without any particular control of PbO atmosphere. A well sintered body of the present composition is obtained by firing in a ceramic crucible with a ceramic cover made of $Al_2O_3$ ceramics. A high sintered density is desirable for humidity resistance and high piezoelectric response when the sintered body is applied to a resonator and others.

Figure 2:
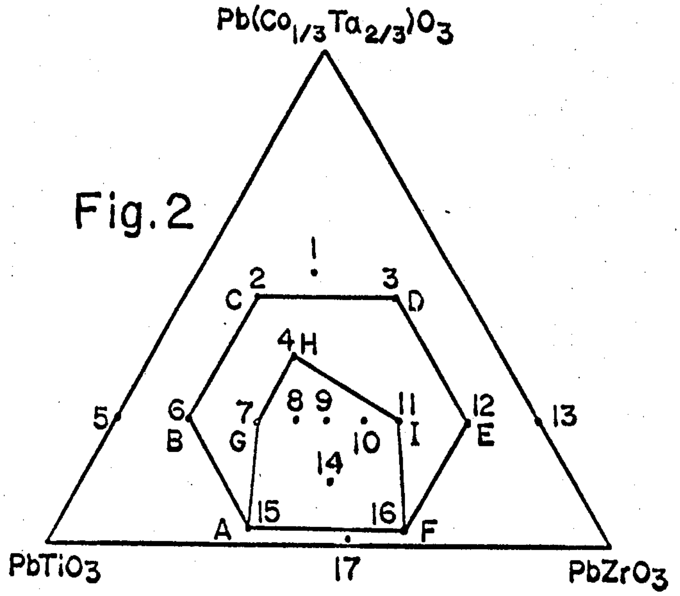
FIG. 2 is a triangular compositional diagram of materials utilized in the present invention.

All possible compositions coming within the ternary system $Pb(Co_{1/3}Ta_{2/3})O_3$-$PtTiO_3$-$PbZrO_3$ are represented by the triangular diagram constituting FIG. 2 of the drawings. Some compositions represented by the diagram, however, do not exhibit high piezoelectricity, and many are electromechanically active only to a slight degree. The present invention is concerned only with those compositions exhibiting piezoelectric response of appreciable magnitude. As a matter of convenience, the planar coupling coefficient ($K_p$) of test discs will be taken as a measure of piezoelectric activity. Thus, within the area bonded by lines connecting points ABCDEF, FIG. 2, all compositions polarized and tested showed a planar coupling coefficient of approximately 0.2 or higher. The compositions in the area of the diagram bounded by lines connecting points A, G, H, I, and F, FIG. 2, exhibit a planar coupling coefficient of approximately 0.3 or higher, the molar percent of the three components of compositions ABCDEFGHI being as follows:

| | $Pb(Co_{1/3}Ta_{2/3})O_3$ | $PbTiO_3$ | $PbTiO_3$ |
|---|---|---|---|
| A | 3.0 | 62.5 | 34.5 |
| B | 25.0 | 62.5 | 12.5 |
| C | 50.0 | 37.5 | 12.5 |
| D | 50.0 | 12.5 | 37.5 |
| E | 25.0 | 12.5 | 62.5 |
| F | 3.0 | 34.5 | 62.5 |
| G | 25.0 | 50.0 | 25.0 |
| H | 37.5 | 37.5 | 25.0 |
| I | 25.0 | 25.0 | 50.0 |

Furthermore, the compositions near the morphotropic phase boundary of the ternary system, particularly $$Pb(Co_{1/3}Ta_{2/3})_{0.250}Ti_{0.39}Zr_{0.36}O_3$$

and $$Pb(Co_{1/3}Ta_{2/3})_{0.125}Ti_{0.435}Zr_{0.440}O_3$$

give ceramic products having a planar coupling coefficient of 0.55 or higher.

According to the present invention, the piezoelectric and dielectric properties of the ceramics can be adjusted to suit various applications by selecting the proper composition.

The compositions described herein can be prepared in accordance with various per se well known ceramic procedures. A preferred method, however, hereinafter more fully described, consists in the use of PbO or $Pb_3O_4$, CoO or $Co_2O_3$, $Ta_2O_5$, $TiO_2$, $ZrO_2$.

The starting materials, viz., lead oxide (PbO), cobalt oxide (CoO), tantalum pentoxide ($Ta_2O_5$), titania ($TiO_2$), zirconia ($ZrO_2$), all of relatively pure grade (e.g., C.P. grade) are intimately mixed in a rubber-lined ball mill with distilled water. In milling the mixture care should be exercised to avoid, or the proportions of ingredients varied to compensate for, contamination by wear of the milling ball or stones.

Following the wet milling, the mixture is dried and mixed to assure as homogeneous a mixture as possible. Thereafter, the mixture is suitably formed into a desired form at a pressure of 400 kilograms per square centimeter. The compacts are pre-reacted by calcination at a temperature of around 850° C. for 2 hours.

After calcination, the reacted material is allowed to cool and is then wet milled to a small particle size. Once again, care should be exercised to avoid, or the proportions of ingredients varied to compensate for, contamination by wear of the milling balls or stones. Depending on preference and the shapes desired, the material may be formed into a mix or slip suitable for pressing, slip casting, or extrading, as the case may be, in accordance with per se conventional ceramic procedures.

The samples for which data are given hereinbelow were prepared by mixing 100 grams of the milled pre-sintered mixture with 5 cc. of distilled water. The mix was then pressed into discs of 20 mm. diameter and 2 mm. thickness at a pressure of 700 kg./cm.². The pressed discs are fired at 1200–1280° C. for a heating period of 45 minutes. According to the present invention, there is no need to fire the composition in an atmosphere of PbO and no special care is required for the temperature gradient in a furnace compared with the prior art. Thus, according to the present invention, uniform and excellent piezoelectric ceramic products can be easily obtained simply by covering the samples with an alumina crucible during firing.

The sintered ceramics are polished on both surfaces to the thickness of one millimeter. The polished disc surfaces may then be coated with silver paint and fired to form silver electrodes. Finally, the discs are polarized while immersed in a bath of silicone oil at 100° C. A voltage gradient of D-C 4 kv. per mm. is maintained for one hour, and the discs are field-cooled to room temperature in thirty minutes.

The piezoelectric and dielectric properties of the polarized specimen have been measured at 20° C. in a relative humidity of 50% and at a frequency of 1 kc. Examples of specific ceramic compositions according to this invention and various pertinent electromechanical and dielectric properties thereof are given in table, infra. From the table it will be readily evident that the exemplary compositions selected from the area bounded by lines connecting points ABCDEF of the diagram of FIG. 2 are characterized by very high mechanical quality factor and high planar coupling coefficient.

The compositions, $Pb(Co_{1/3}Ta_{2/3})_{0.25}Ti_{0.43}Zr_{0.32}O_3$ and $Pb(Co_{1/3}Ta_{2/3})_{0.125}Ti_{0.435}Zr_{0.44}O_3$, show a high resonant frequency stability with temperature within the range from −20° C to 80° C. The changes in resonant frequency are 0.15% and 0.1%, respectively. These properties are important to the use of piezoelectric compositions in filter applications.

TABLE

| | Mole percent of composition | | | 24 hours after poling | | |
|---|---|---|---|---|---|---|
| Ex. No. | $Pb(Co_{1/3}Ta_{2/3})O_3$ | $PbTiO_3$ | $PbZrO_3$ | Dielectric constant ε, at 1 kc./s. | Planar coupling coeff., $K_p$ | Mechanical quality factor, $Q_M$ |
| 1 | 55.0 | 25.0 | 20.0 | 2,174 | 0.114 | 263 |
| 2 | 50.0 | 37.5 | 12.5 | 2,340 | 0.239 | 506 |
| 3 | 50.0 | 12.5 | 37.5 | 1,492 | 0.207 | 522 |
| 4 | 37.5 | 37.5 | 25.0 | 1,874 | 0.554 | 685 |
| 5 | 25.0 | 75.0 | | 370 | 0.113 | 517 |
| 6 | 25.0 | 62.5 | 12.5 | 415 | 0.211 | 682 |
| 7 | 25.0 | 50.0 | 25.0 | 858 | 0.325 | 643 |
| 8 | 25.0 | 43.0 | 32.0 | 1,523 | 0.522 | 582 |
| 9 | 25.0 | 39.0 | 36.0 | 1,206 | 0.565 | 620 |
| 10 | 25.0 | 31.0 | 44.0 | 475 | 0.413 | 895 |
| 11 | 25.0 | 25.0 | 50.0 | 439 | 0.317 | 912 |
| 12 | 25.0 | 12.5 | 62.5 | 386 | 0.209 | 1,984 |
| 13 | 25.0 | | 75.0 | 358 | 0.071 | 1,720 |
| 14 | 12.5 | 43.5 | 44.0 | 864 | 0.568 | 726 |
| 15 | 3.0 | 62.5 | 34.5 | 335 | 0.307 | 683 |
| 16 | 3.0 | 34.5 | 62.5 | 392 | 0.312 | 795 |
| 17 | 1.0 | 46.0 | 53.0 | 544 | 0.294 | 474 |

With the aid of the said table, the values of mechanical quality factor, planar coupling coefficient and dielectric constant can be adjusted to suit various applications by selecting the appropriate composition.

In addition to the superior properties shown above, compositions according to the present invention yield ceramics of good physical quality and which polarize well. Thus, the ternary ceramic $Pb(Co_{1/3}Ta_{2/3})O_3$-$PtTiO_3$-$PbZrO_3$ forms an excellent piezoelectric ceramic body.

What is claimed is:

1. A piezoelectric ceramic composition consisting essentially of a solid solution of a material selected from the area bounded by lines connecting points A, B, C, D, E, and F of the diagram of FIG. 2, wherein A, B, C, D, E, and F have the following formula:

(A) $Pb(Co_{1/3}Ta_{2/3})_{0.030}Ti_{0.625}Zr_{0.345}O_3$
(B) $Pb(Co_{1/3}Ta_{2/3})_{0.250}Ti_{0.625}Zr_{0.125}O_3$
(C) $Pb(Co_{1/3}Ta_{2/3})_{0.500}Ti_{0.375}Zr_{0.125}O_3$
(D) $Pb(Co_{1/3}Ta_{2/3})_{0.500}Ti_{0.125}Zr_{0.375}O_3$
(E) $Pb(Co_{1/3}Ta_{2/3})_{0.250}Ti_{0.125}Zr_{0.625}O_3$
(F) $Pb(Co_{1/3}Ta_{2/3})_{0.030}Ti_{0.345}Zr_{0.625}O_3$

2. A piezoelectric ceramic composition consisting essentially of a solid solution of a material selected from the area bounded by lines connecting points A, G, H, I, and F of the diagram of FIG. 2, wherein A, G, H, I, and F have the following formula:

(A) $Pb(Co_{1/3}Ta_{2/3})_{0.030}Ti_{0.625}Zr_{0.345}O_3$
(G) $Pb(Co_{1/3}Ta_{2/3})_{0.250}Ti_{0.500}Zr_{0.250}O_3$
(H) $Pb(Co_{1/3}Ta_{2/3})_{0.375}Ti_{0.375}Zr_{0.250}O_3$
(I) $Pb(Co_{1/3}Ta_{2/3})_{0.250}Ti_{0.250}Zr_{0.500}O_3$
(F) $Pb(Co_{1/3}Ta_{2/3})_{0.030}Ti_{0.345}Zr_{0.625}O_3$

3. An electrochemical transducer element consisting essentially of a piezoelectric ceramic composition as claimed in claim 2.

4. A piezoelectric ceramic material consisting of the solid solution having the following formula:

$$Pb(Co_{1/3}Ta_{2/3})_{0.25}Ti_{0.43}Zr_{0.32}O_3$$

5. A piezoelectric ceramic material consisting of the solid solution having the following formula:

$$Pb(Co_{1/3}Ta_{2/3})_{0.125}Ti_{0.435}Zr_{0.44}O_3$$

References Cited

UNITED STATES PATENTS

| | | | |
|---|---|---|---|
| 3,268,453 | 8/1966 | Ouchi et al. | 252—62.9 |
| 3,400,076 | 9/1968 | Ouchi et al. | 252—62.9 |
| 3,403,103 | 9/1968 | Ouchi et al. | 252—62.9 |

TOBIAS E. LEVOW, Primary Examiner

J. COOPER, Assistant Examiner

U.S. Cl. X.R.

106—39